United States Patent
Kikuchi et al.

(10) Patent No.: US 9,306,521 B2
(45) Date of Patent: Apr. 5, 2016

(54) VEHICULAR AUDIO PROCESSING UNIT AND COMMUNICATION SYSTEM INCLUDING SAME

(71) Applicant: HONDA MOTOR CO., LTD., Minato-ku, Tokyo (JP)

(72) Inventors: Yutaka Kikuchi, Saitama (JP); Koji Suzuki, Saitama (JP); Katsuhisa Yamada, Saitama (JP); Makoto Hattori, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 238 days.

(21) Appl. No.: 14/032,465

(22) Filed: Sep. 20, 2013

(65) Prior Publication Data

US 2014/0093087 A1 Apr. 3, 2014

(30) Foreign Application Priority Data

Sep. 28, 2012 (JP) ................................. 2012-218331

(51) Int. Cl.
  *H03G 3/20* (2006.01)
  *H03G 3/32* (2006.01)
  *B62J 99/00* (2009.01)

(52) U.S. Cl.
  CPC . *H03G 3/20* (2013.01); *H03G 3/32* (2013.01); *B62J 2099/0006* (2013.01)

(58) Field of Classification Search
  CPC ...... H03G 3/32; H04R 2499/13; H04R 5/033; H04R 27/00; H04R 1/08; G10K 2210/1282; B60R 11/0217
  USPC .............. 379/57, 86, 311, 302, 78, 71.4, 365, 379/389
  See application file for complete search history.

(56) References Cited

U.S. PATENT DOCUMENTS

| | | | | |
|---|---|---|---|---|
| 4,558,460 | A | * | 12/1985 | Tanaka et al. ................... 381/86 |
| 5,809,152 | A | * | 9/1998 | Nakamura ........... G10K 11/178 381/71.1 |
| 2004/0252846 | A1 | * | 12/2004 | Nonaka .............. G10K 11/1788 381/71.4 |
| 2006/0029235 | A1 | * | 2/2006 | Lazzeroni et al. .............. 381/86 |
| 2006/0069499 | A1 | | 3/2006 | Suzuki et al. |
| 2008/0085679 | A1 | * | 4/2008 | Fettig ....................... H04B 5/06 455/41.2 |
| 2012/0230504 | A1 | * | 9/2012 | Kuroda ................ G10K 11/178 381/71.4 |
| 2012/0323532 | A1 | * | 12/2012 | Yoshioka ............... G08G 1/166 702/189 |

FOREIGN PATENT DOCUMENTS

| | | |
|---|---|---|
| EP | 1 580 883 A1 | 9/2005 |
| JP | 2004-104684 A | 4/2004 |
| WO | 2008/070093 A1 | 6/2008 |

* cited by examiner

*Primary Examiner* — Akelaw Teshale
(74) *Attorney, Agent, or Firm* — Carrier Blackman & Associates, P.C.; Joseph P. Carrier; William D. Blackman

(57) ABSTRACT

A vehicular audio processing unit includes a receiver that receives voice data by wirelessly communicating with audio equipment, an audio processor that applies predetermined audio processing to the voice data received by the receiver, a transmitter that transmits the voice data to which the audio processor applies the predetermined audio processing by wirelessly communicating with an audio output device that can output a sound, and a sensor that detects an operational status of a vehicle with which the unit is provided. The audio processor automatically modifies the predetermined audio processing based on the operational status detected by the operational status detector to the voice data received by the receive, thereby the user is not required to perform any operation for varying the voice output according to an operational status of the vehicle.

17 Claims, 5 Drawing Sheets

_US 9,306,521 B2_

VEHICULAR AUDIO PROCESSING UNIT AND COMMUNICATION SYSTEM INCLUDING SAME

TECHNICAL FIELD

The present invention relates to a vehicular audio processing unit which acquires voice data in a voice file from a first external device such as a smartphone that has stored the voice file via radio, download, etc., which transmits the same to a second external device such as a head set which is provided in conjunction with a vehicle. Herein "voice" includes not only speech, but also other audio such as music and other sounds.

BACKGROUND ART

JP-A No. 2004-104684 discloses a wireless head set device for a motorcycle that enables a user to listen to voice from portable audio equipment provided with a radio communication facility using the wireless head set.

According to a technique disclosed in JP-A No. 2004-104684, as it is difficult for the user to hear/understand voice that flows from the head set in a case that noise (a running sound) caused according to an operational status of the vehicle increases when a piece of music (voice) from the portable audio equipment is being listened to with the head set while a motorcycle is traveling, an operating device mounted in the portable audio equipment, the head set, or elsewhere is required to be operated to vary volume every time the operational status of the vehicle varies, and this is troublesome to a user.

SUMMARY OF THE INVENTION

With the foregoing in mind, the present invention provides a vehicular audio processing unit that permits a user to clearly hear and understand voice output that flows from a head set or other device, while reducing an operating burden on the user relative to varying the volume or other characteristic of the voice output even if an operational status of a vehicle varies.

A vehicular audio processing unit according to the present invention may be embodied in the following aspects. In the following discussion of the invention aspects reference numbers in parentheses correspond to components of the exemplary embodiment of the invention presented in this disclosure to facilitate the understanding of the present invention. It will be understood, however, that the present invention is not limited to the exemplary embodiment or to the specific components thereof.

According to a first aspect of the present invention there is provided a vehicular audio processing unit which comprises: a receiver (160) that is configured to receive voice data by wirelessly communicating with a first external device (14), an audio processor (156) that is configured to apply predetermined audio processing to the voice data received by the receiver (160), a transmitter (162) that is configured to transmit the voice data to which the audio processor (156) applies the predetermined audio processing by wirelessly communicating with a second external device (16) that can output sound, and an operational status detector (164, 166) that detects an operational status of a vehicle (50) with which the vehicular audio processing unit is provided, wherein the audio processor (156) modifies the predetermined audio processing applied to the voice data received by the receiver (160) based on the operational status detected by the operational status detector (164, 166).

According to a second aspect of the present invention, in addition to the first aspect, the operational status detector (164) detects the speed of the vehicle (50) and the audio processor (156) adjusts the predetermined audio processing so that as the speed of the vehicle (50) increases, the volume of the voice data is also appropriately increased.

According to a third aspect of the present invention, in addition to the first or second aspect, the vehicular audio processing unit further comprises an analog voice input device (26b) to which another external device is connected and which acquires analog voice data from the other external device, and the audio processor (156) performs such audio processing that voice data acquired by the analog voice input device (26b) is mixed with the voice data received by the receiver (160).

According to a fourth aspect of the present invention, in addition to any of the first-third aspects, an operating device (18) for operating the first external device (14) is connected to the vehicular audio processing unit (10) and the transmitter (162) transmits a user input signal from the operating device (18) to the first external device (14).

According to a fifth aspect of the present invention, in addition to the fourth aspect, the operating device (18) is provided to a steering handlebar (60) of the vehicle (50).

According to a sixth aspect of the present invention, in addition to any of the first-fifth aspects, the vehicle (50) is a motorcycle and the vehicular audio processing unit (10) is arranged on an upper part of a rear portion of a body frame (52) of the motorcycle (50) or on the lateral side of the rear portion.

According to a seventh aspect of the present invention, in addition to any of the first-fifth aspects, the vehicle (50) is a motorcycle and the vehicular audio processing unit (10) is arranged inside a lateral side of a front cowl (92) attached in front of a body frame (52) of the motorcycle (50).

According to an eighth aspect of the present invention, in addition to the seventh aspect, a storage box (122L, 122R) is provided near the lateral side of the front cowl (92) and the vehicular audio processing unit (10) is arranged near the storage box (122L, 122R).

According to a ninth aspect of the present invention, in addition to any of the first-eighth aspects, the vehicular audio processing unit (10) includes a metal case (10a) and at least a part of the case (10a) is made of a transmissive member (28) that transmits electromagnetic waves used in the transmitter (162) and the receiver (160).

According to a tenth aspect of the present invention, in addition to the ninth aspect, the vehicular audio processing unit (10) is arranged with the transmissive member (28) directed either upward in the vehicle (50) or in a direction of a rider's seat of the vehicle.

Advantageous Effects of Invention

According to the first aspect of the present invention, as the audio processor automatically applies audio processing according to the operational status detected by the operational status detector to the voice data received by the receiver and transmits the voice data to which audio processing is applied to the second external device, the user can listen to voice output to which the audio processing is applied by the second external device and the user is not himself/herself required to perform any operation for varying the voice output according to an operational status of the vehicle.

According to the second aspect of the present invention, as the audio processor performs such audio processing that the higher the speed of the vehicle is, the more volume is increased, the user can listen to voice at suitable volume without himself/herself performing an operation to increase volume when a running sound grows bigger, and the user can conveniently listen to the voice output at an appropriate volume level.

According to the third aspect of the present invention, as the audio processor performs such audio processing that voice data acquired by the analog voice input device (26b) is mixed with voice data received by the receiver, the user can simultaneously listen to the voice data received from the first external device and the voice data acquired from another external device.

According to the fourth aspect of the present invention, as the operating device for operating the first external device is connected to the vehicular audio processing unit and the transmitter transmits a user input signal from the operating device to the first external device, the user can conveniently operate the first external device via the operating device.

According to the fifth aspect of the present invention, as the operating device is provided to the steering handlebar of the vehicle, the user can safely operate the external device via the operating device without separating his/her hand from the steering handlebar.

According to the sixth aspect of the present invention, as the vehicle is a motorcycle and the vehicular audio processing unit is arranged on an upper part of a rear portion of the body frame of the motorcycle or on the lateral side of the rear portion, the vehicular audio processing unit can wirelessly communicate in a satisfactory state without attenuating electromagnetic waves by radio communication by the body frame when the user wears or supports on his/her body the first external device and the second external device.

According to the seventh aspect of the present invention, as the vehicle is a motorcycle and the vehicular audio processing unit is arranged inside of the lateral side of the front cowl which is attached in front of the body frame of the motorcycle and which is made of resin, the vehicular audio processing unit can wirelessly communicate in a satisfactory state without attenuating electromagnetic waves by radio communication by the body frame when the user wears or supports on his/her body the first external device and the second external device.

According to the eighth aspect of the present invention, as the storage box is provided near the lateral side of the front cowl and the vehicular audio processing unit is arranged near the storage box, the first external device may be housed in the storage box, a radio communication range can be reduced, and housing capacity and radio communication in a satisfactory state can be made compatible.

According to the ninth aspect of the present invention, as the case of the vehicular audio processing unit is made of metal and at least a part of the case is made of the transmissive member that transmits electromagnetic waves used in the transmitter and the receiver, radio communication can be made in a satisfactory state by the transmissive member, securing heat resistance and resistance to electromagnetic wave noise of the unit itself with the metal case.

According to the tenth aspect of the present invention, as the vehicular audio processing unit is arranged with the transmissive member directed either upward in the vehicle (50) or in a direction of a rider's seat of the vehicle, radio communication can be made in a satisfactory state.

Purpose of Disclosure

Although the following disclosure offered for public dissemination is detailed to ensure adequacy and aid in understanding of the invention, this is not intended to prejudice that purpose of a patent which is to cover each new inventive concept therein no matter how it may later be disguised by variations in form or additions of further improvements. The claims at the end hereof are the chief aid toward this purpose, as it is these that meet the requirement of pointing out the improvements, combinations and methods in which the inventive concepts are found.

There has been chosen a specific exemplary embodiment of a vehicular audio processing unit according to the invention and specific alternative structures and modifications thereto, the embodiment chosen for the purposes of illustration and description of the structure and method of the invention is shown in the accompanying drawings forming a part of the specification.

DETAILED DESCRIPTION OF EXEMPLARY EMBODIMENTS

Referring to the attached drawings, a present exemplary embodiment of a vehicular audio processing unit 10 according to the present invention will be described in detail below.

Figure 1:
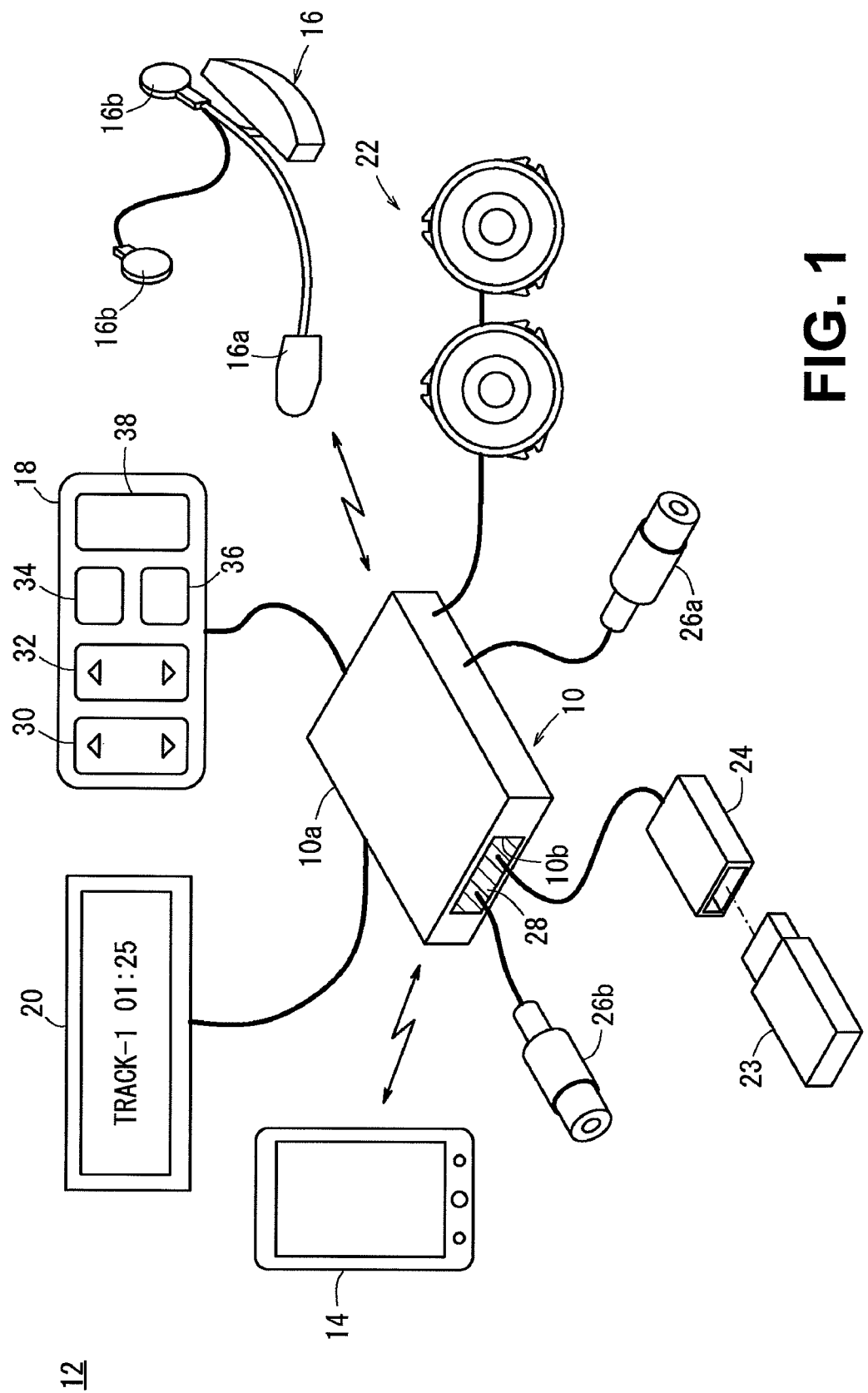
FIG. 1 shows a communication system using a vehicular audio processing unit according to an exemplary embodiment of the present invention.

FIG. 1 shows a communication system 12 using the vehicular audio processing unit 10. The communication system 12 also includes at least: an audio equipment (a first external device) 14 that stores an audio or voice file (for example, a music file such as MP3) such as a smartphone, a digital audio player, an IC recorder, etc. and can communicate with the vehicular audio processing unit 10; an audio output device (a second external device) 16 such as a head set provided with a microphone 16a that can be worn by a user, can provide voice output and can communicate with the vehicular audio processing unit 10 and an earphone 16b; and an operating device 18 connected to the vehicular audio processing unit 10 that can be used to operate the communication system 12. The vehicular audio processing unit 10, the audio equipment 14, and/or the audio output device 16 may mutually receive and transmit signals by radio communication using Bluetooth (registered trademark), WiFi (registered trademark), etc. The audio equipment 14 and the audio output device 16 may be worn or otherwise carried by a rider and/or others.

The audio output device 16 may be also a speaker that can wirelessly communicate, and the speaker may be also attached to a vehicle. Further, the audio equipment 14 may be also housed in a storage box 122L, 122R, a trunk box 84 or a side bag 100L, 100R (see FIGS. 2 and 3), etc. of the vehicle.

In this embodiment, the communication system 12 is provided with: a display 20 that displays predetermined information such as status information (a tune name, an artist name, an album name, reproduced time, etc.) of a currently playing (output from the audio output device 16) voice file and a state of connection in radio communication (information of what device or equipment is connected to the vehicular audio processing unit 10; a stereo speaker 22; a USB interface I/F 24 for connecting the vehicular audio processing unit 10 and a USB (universal serial bus) memory 23; a LINE OUT terminal (analog voice data output means-device) 26a and an AUX IN terminal (analog voice input means-device) 26b respectively for connecting the vehicular audio processing unit 10 and external equipment. The display 20, the stereo speaker 22, the USB interface I/F 24, the LINE OUT terminal 26a, and the AUX IN terminal 26b are connected to the vehicular audio processing unit 10.

The vehicular audio processing unit 10 receives audio-voice data (music data, etc.) in an voice file from the audio equipment 14, performs predetermined audio processing, and transmits the voice data after the audio processing to the audio output device 16. The vehicular audio processing unit 10 may also output the voice data after the audio processing to the stereo speaker 22.

A case 10a of the vehicular audio processing unit 10 may be made of a metal member, the case 10a may be provided with an opening 10b in a part of the case, and a transmissive member 28 that transmits electromagnetic waves used in radio communication may be provided to the opening 10b. As shown a cable that connects the USB interface I/F 24 and the vehicular audio processing unit 10 and a cable that connects the AUX IN terminal 26b and the vehicular audio processing unit 10 are provided so as to pierce or extend through the transmissive member 28.

The operating device 18 may be provided with a track button 30 for selecting a sound transmitted by the audio equipment 14, a volume button 32 for switching the volume of voice output from the stereo speaker 22 or the audio output device 16, a mode switching button 34 for switching modes, a mute button 36 for turning on/off noise reduction, and a power button 38 for turning on/off the power supply of the vehicular audio processing unit 10.

Figure 2:
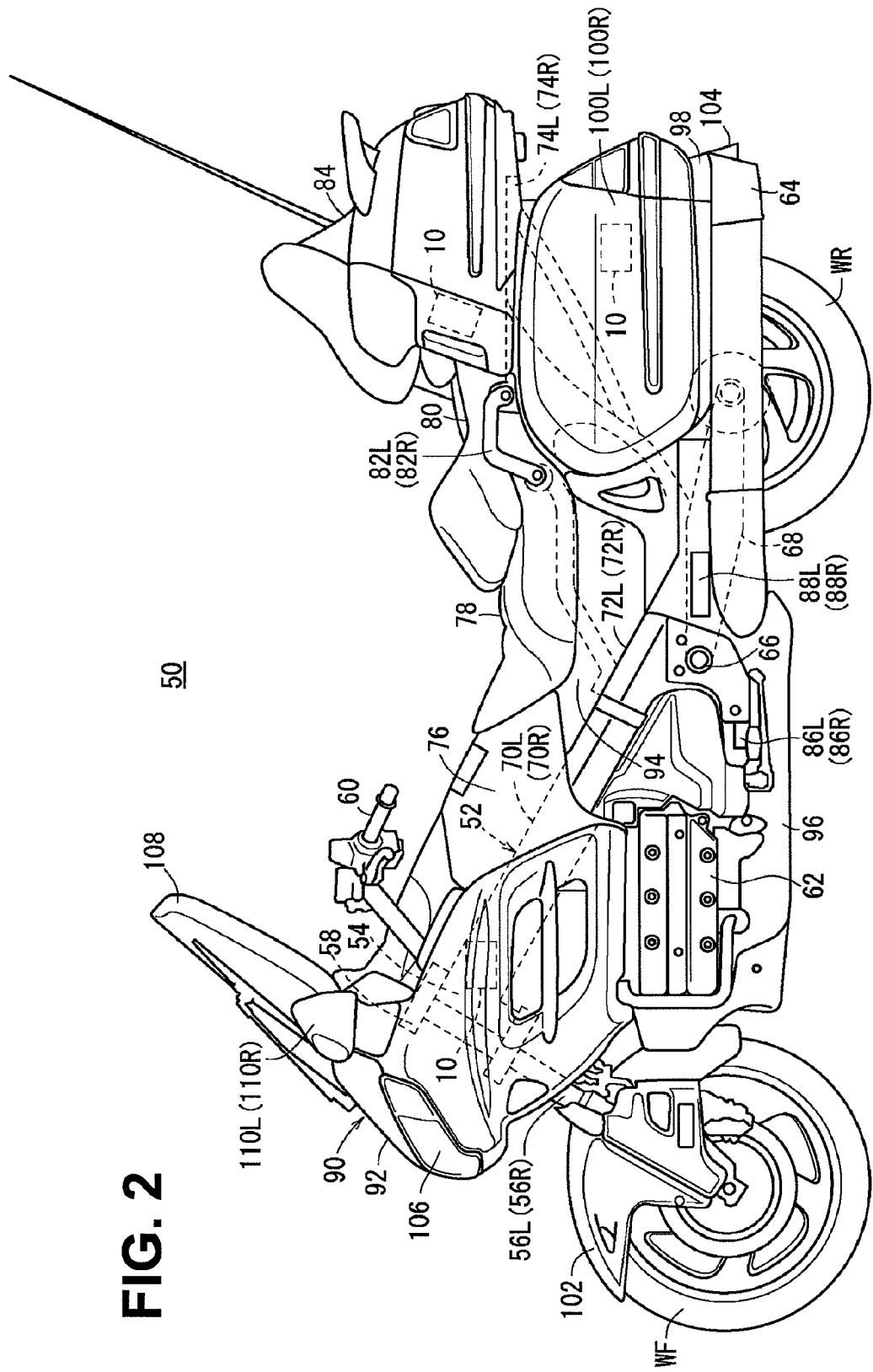
FIG. 2 is a left side view showing a motorcycle having the vehicular audio processing unit shown in FIG. 1 mounted thereon.

FIG. 2 is a left side view showing a motorcycle 50 in which the vehicular audio processing unit 10 in this embodiment is mounted. A reference sign L is allocated to a left one of a pair of mechanisms or components each of which is symmetrically provided in a lateral direction of the vehicle and R is allocated to a right one of the pair.

The motorcycle 50 as the vehicle is provided with a body frame 52, a head pipe 54 provided to a front end of the body frame 52, a pair of left and right front forks 56L, 56R rotatably journaled to the head pipe 54, a front wheel WF attached to the pair of front forks 56L, 56R, a steering handlebar 60 connected via a top bridge 58 that supports upper parts of the front forks 56L, 56R and provided with a handlebar and grips provided to both ends of the handlebar, an engine 62 which is a driving source of the motorcycle 50 and which is supported by the body frame 52, a muffler 64 coupled via an exhaust pipe (not shown) of the engine 62, a swing arm 68 swingably supported by a pivot 66 located in a lower part of the rear of the body frame 52 and a rear wheel (a driving wheel) WR attached to a rear end of the swing arm 68.

The body frame 52 is provided with a pair of left and right main frames 70L, 70R laterally branched from the head pipe 54 and extended backward and diagonally downward, a pair of left and right pivot plates 72L, 72R connected to the rears of the pair of main frames 70L, 70R and a pair of left and right seat frames 74L, 74R extended backward and diagonally upward from the fronts and the rears of the pivot plates 72L, 72R. The pivot 66 is provided to the pair of left and right pivot plates 72L, 72R. A fuel tank 76 is provided on the upsides of the main frames 70L, 70R, a rider seat 78 and a pillion passenger seat 80 are attached onto upper parts of the seat frames 74L, 74R, a pair of left and right grab rails 82L, 82R are attached on the lateral sides of the pillion passenger seat 80, and the trunk box 84 is attached at the back of the pillion passenger seat 80.

A pair of left and right steps 86L, 86R for the rider (the user) seated on the rider seat 78 and a pair of left and right steps 88L, 88R for a pillion passenger (a user) seated on the pillion passenger seat 80 are attached to the pivot plates 72L, 72R of the body frame 52.

A body cover 90 is attached to the body frame 52, the body cover 90 is provided with a front cowl 92 that covers the front side of a vehicle body and that is made of resin, a pair of right and left side covers 94 that cover the lateral sides of the vehicle body, an under cover 96 that covers a lower part of the vehicle body and a rear seat cowl 98 that covers the rear of the vehicle body and that is made of resin, and a pair of left and right side bags 100L, 100R are integrated with the rear seat cowl 98.

A front fender 102 that covers the front wheel WF is attached to the front forks 56L, 56R and a rear fender 104 that covers the rear wheel WR is attached to the rear seat cowl 98. A headlight 106 is attached to the front of the front cowl 92, a windshield 108 is attached on the upside of the headlight, and side mirrors 110L, 110R are attached to left and right ends of the windshield.

Figure 3:
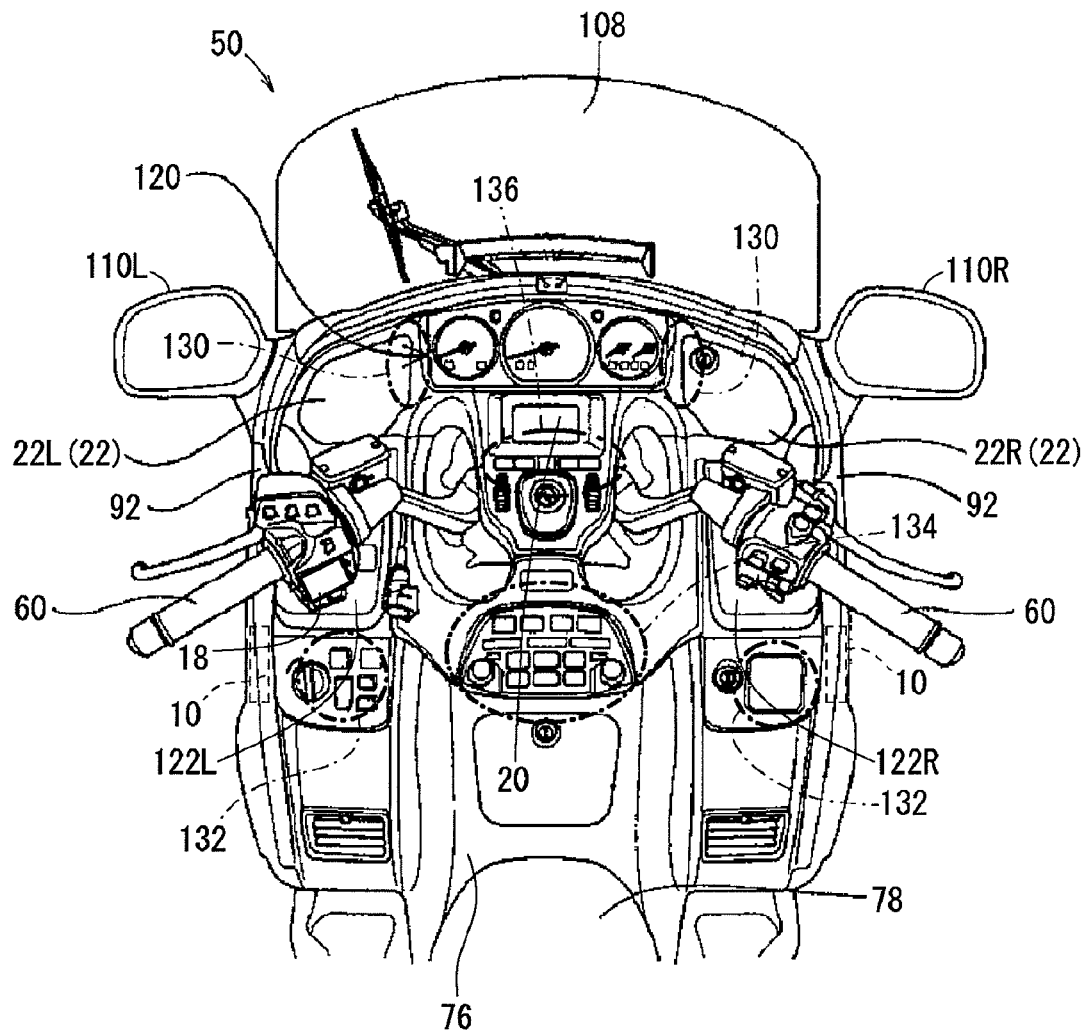
FIG. 3 is an enlarged view showing a part of the motorcycle in the vicinity of a steering handlebar shown in FIG. 2.

FIG. 3 is an enlarged view showing a part of the motorcycle 50 in the vicinity of the steering handlebar 60 shown in FIG. 2. A meter unit 120 is arranged on the front side in the vehicle body of the steering handlebar 60, the pair of left and right storage boxes 122L, 122R are provided on the downside of the steering handlebar 60 and in the vicinities on the right and left sides of the front cowl 92, and the pair of left and right stereo speakers 22 (22L, 22R) are provided in front of the storage boxes 122L, 122R. In this exemplary embodiment, the display 20 that displays information is provided to the center of the steering handlebar 60 and the operating device 18 is provided on the left side of the steering handlebar 60. The operating device 18 may also be provided in an area 130 in which operation is easy to perform in the vicinity of the meter unit 120, in an area 132 in the vicinity of the grip of the steering handlebar 60, in an area 134 in which a switch, etc. are provided in the vicinity of the fuel tank 76 or in an area 136 in which a switch, etc. are provided in the vicinity of the display 20. The user can also simply operate the operating device 18 by providing the operating device 18 in the vicinity of any of these when he/she is seated on the motorcycle.

The vehicular audio processing unit 10 may be also arranged in the trunk box 84 on the upside of the rear of the body frame 52 as shown in FIG. 2 and may be also arranged in the side bag 100L or 100R on the lateral side of the rear of the body frame 52. Besides, the vehicular audio processing unit 10 may be also arranged inside the vicinity on the lateral side of the front cowl 92. In this case, as shown in FIG. 3, the vehicular audio processing unit 10 may be also arranged in the vicinity of the storage box 122L or 122R. The vehicular audio processing unit 10 may be arranged with its transmissive member 28 either directed on the upside of the motorcycle 50 or directed toward the seats 78, 80.

Figure 4:
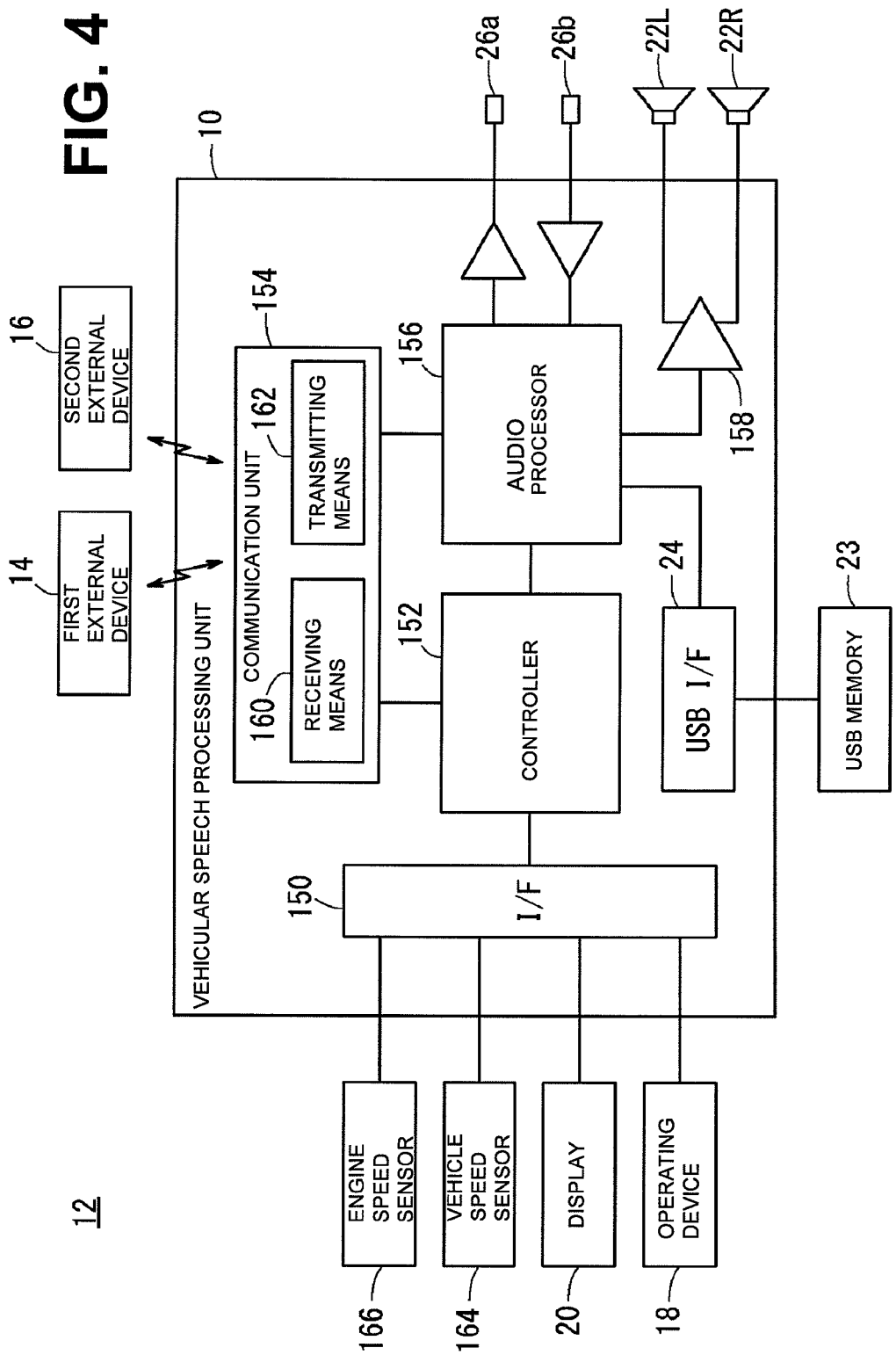
FIG. 4 is a block diagram showing the electric-operational configuration of the vehicular audio processing unit shown in FIG. 1.

FIG. 4 is a block diagram showing the electric configuration of the vehicular audio processing unit 10 which is provided with the USB interface I/F 24, the LINE OUT terminal 26a, the AUX IN terminal 26b, an interface I/F 150, a controller 152, a communication unit 154, an audio processor 156 and an amplifier 158.

A user input signal generated based on the operation of the operating device 18 by a user, a detection signal from a vehicle speed sensor (an operational status detection means-device) 164 provided to the motorcycle 50 for detecting vehicle speed, which is one type of an operational status of the motorcycle 50, and a detection signal by an engine speed sensor (another operational status detection means-device) 166 provided to the motorcycle 50 for detecting the number of revolutions of the engine 62 (hereinafter called engine speed), which is another type of the operational status of the motorcycle 50, are transmitted to the controller 152 via the interface I/F 150. The controller 152 outputs display information (a tune name, an album name, etc.) to the display 20 via the interface I/F 150.

The controller 152 is provided with CPU not shown, a memory that stores programs, etc., and functions as the controller 152 in this embodiment by executing a program stored in the storage by the CPU. The controller 152 controls the whole vehicular audio processing unit 10. The controller 152 calculates vehicle speed based upon a detection signal by the vehicle speed sensor 164 and outputs the calculated vehicle speed to the vehicular audio processor 156.

Besides, the controller 152 outputs an instruction signal (a signal when the track button 30 is operated) that instructs the selection of a voice file (a music file and others) to the communication unit 154 when the controller acquires the user input signal from the operating device 18 indicative of the user's desire, and outputs a control signal for controlling volume and a control signal for controlling the turn-on/off of noise reduction to the audio processor (the audio processor) 156 when the controller acquires a user input signal that instructs volume adjustment (a signal when the volume button 32 is operated by the user) and a user input signal that instructs to turn on/off noise reduction (a signal when the mute button 36 is operated by the user) from the operating device 18.

The communication unit 154 wirelessly communicates with the audio equipment 14 and the audio output device 16 and is provided with a receiving means or receiver 160 and a transmitting means or transmitter 162. The receiving means 160 receives voice data in a voice file from the audio equipment 14.

The transmitting means 162 transmits the manipulate signal that instructs the selection of an voice data file to the audio equipment 14 and transmits voice data to which audio processing is applied by the audio processor 156 to the audio output device 16. The audio output device 16 reproduces voice data when the audio output device receives the voice data transmitted by the transmitting means 162. That is, the audio output device 16 outputs voice from the earphone 16b based upon the voice data by converting the voice data in the received digital signal to an analog signal. When radio communication is made using Bluetooth (registered trademark), an advanced audio distribution profile (A2DP) which is a profile for transmitting voice, and an audio/video remote control profile (AVRCP) which is a profile for transmitting a manipulate signal, are used.

The audio processor 156 applies audio processing to voice data received based upon the control signal for controlling volume and the control signal for controlling the turn-on/off of noise reduction, and outputs its result to the communication unit 154. The transmitting means 162 of the communication unit 154 transmits the voice data transmitted from the audio processor 156 to the audio output device 16.

Besides, the audio processor 156 may also apply audio processing to voice data received by the receiving means 160 so that volume (a sound pressure level) increases according to vehicle speed transmitted from the controller 152. Audio processing is applied so that volume increases because a running sound of the motorcycle 50 gets louder as vehicle speed gets higher. Moreover, for audio processing, processing whereby volume is varied every frequency of voice data can be also performed.

The audio processor 156 may also output a sound (for example, a tune) based upon voice data to which audio processing is applied from the stereo speaker 22 (22L, 22R) by outputting an analog signal to the amplifier 158. In addition, the vehicular audio processing unit 10 acquires voice data (voice data in a voice file transmitted by the audio equipment 14) via the receiving means 160. However, the vehicular audio processing unit may also acquire voice data (a digital signal) in a voice file from the USB memory (the third external device) 23.

Figure 5:
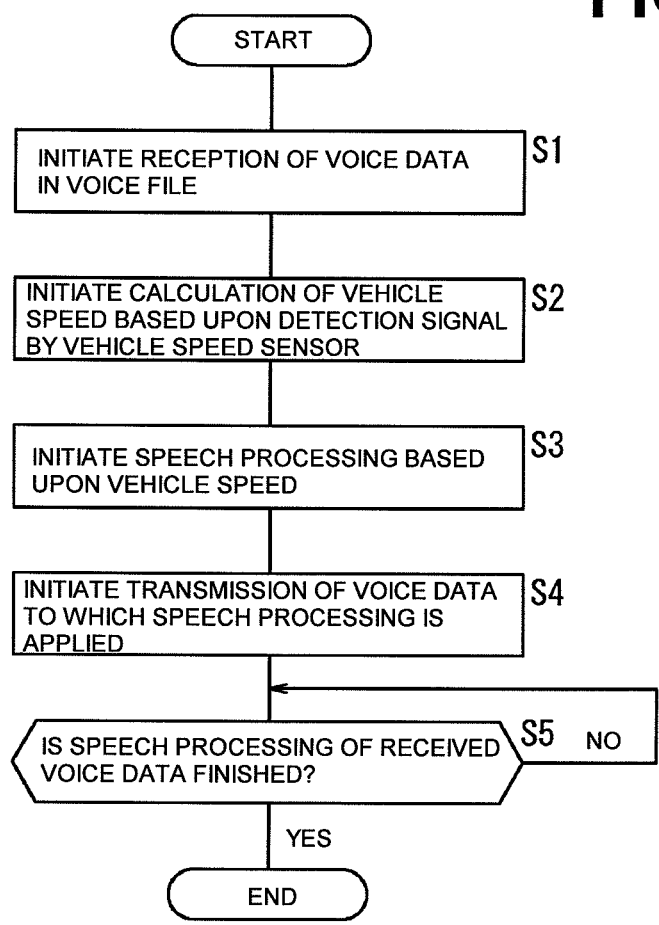
FIG. 5 is a flowchart showing an exemplary operation of the vehicular audio processing unit shown in FIG. 1.

Next, an operation of the vehicular audio processing unit 10 will be described according to a flowchart shown in FIG. 5. When the audio equipment 14 starts to transmit voice data in a voice file, the receiving means 160 of the communication unit 154 starts to receive the voice data in the transmitted voice file (a step S1). The voice data received by the receiving means 160 is output to the audio processor 156. The voice data in the voice file transmitted by the audio equipment 14 is voice data in a voice file selected according to the operation by the user of the operating device 18, in a voice file selected according to a fixed rule, or in a voice file selected at random.

Next, the controller 152 starts to calculate vehicle speed based upon a detection signal detected by the vehicle speed sensor 164 (a step S2). As the vehicle speed sensor 164 detects vehicle speed at a fixed cycle, the controller 152 calculates vehicle speed at the fixed cycle. The vehicle speed calculated by the controller 152 is output to the audio processor 156.

Next, the audio processor 156 initiates audio processing to the voice data acquired in the step S1 based upon the vehicle speed calculated in the step S2 (a step S3). For example, the audio processing is applied to the voice data so that the higher the vehicle speed is, the greater the output volume is.

Next, the transmitting means 162 of the communication unit 154 initiates the transmission of the voice data to which audio processing is applied in the step S3 to the audio output device 16 (a step S4). Next, the controller 152 determines whether the reception of the voice data in the voice file by the receiving means 160 is completed or not and whether audio processing to all voice data in the received voice file is finished or not (a step S5). In the step S5, when the controller determines that the audio processing to all the voice data is not finished, a control flow remains at the step S5 until the controller determines that the audio processing to all the voice data is finished.

The audio processor 156 may also perform such audio processing that sound data in an opposite phase to engine noise corresponding to engine speed which the controller 152 calculates based upon a detection signal detected by the engine speed sensor 166 is mixed with the voice data received by the receiving means 160. In this case, the sound data in the opposite phase to the engine noise corresponding to the engine speed is stored in the audio processor 156. The audio processor 156 outputs voice data acquired by applying audio processing to the communication unit 154. Hereby, voice data in which the engine noise is canceled can be generated.

Besides, the vehicular audio processing unit 10 may be provided with a microphone (not shown) that acquires a running sound of the motorcycle 50, creates sound data in an opposite phase to sound data of the running sound acquired by the microphone, and may also perform audio processing in which the sound data is mixed with the received voice data. Moreover, even if the vehicular audio processing unit 10 itself is not provided with the microphone, an external microphone may be connected to the AUX IN terminal 26b of the vehicular audio processing unit 10 and the processing unit may perform such audio processing that sound data in an opposite phase to sound data of a running sound acquired by the external microphone is created and the sound data is mixed with the received voice data.

As described above, as the audio processor 156 applies audio processing according to an operational status (vehicle speed, and engine speed) detected by the vehicle speed sensor 164 and the engine speed sensor 166 to voice data received by the receiving means 160 and transmits the voice data to which the audio processing is applied to the audio output device 16, the user can conveniently listen to voice output to which the audio processing is applied by the audio output device 16 and the user himself/herself is not required to perform any operation for adjusting the voice output according to the operational status of the vehicle.

For example, as the audio processor 156 performs audio processing so that the higher vehicle speed is, the greater volume is, the user can listen to voice at suitable volume without himself/herself operating to increase volume when a running sound increases according to the increase of vehicle speed, and so that the user can listen to an appropriate voice output with ease. Further, when the audio processor 156 performs such audio processing that sound data in an opposite phase to engine noise corresponding to engine speed is mixed, voice output in which the engine noise is canceled can be easily listened to without burdening the user to perform any operation to effect the noise cancellation.

As the operating device 18 for operating the audio equipment 14 is connected to the vehicular audio processing unit 10, the user can conveniently operate the audio equipment 14. Furthermore, the user can safely operate the audio equipment via the operating device 18 without separating his/her hands from the steering handlebar 60.

Radio communication can be satisfactorily made by arranging the vehicular audio processing unit 10 on the upside (for example, in the trunk box 84) of the rear of the body frame 52 of the motorcycle 50 or on the lateral side of the vehicle's rear portion (for example, in the side bag 100L, 100R) without attenuating an electromagnetic wave by the radio communication by the body frame 52 in a case that the user wears or supports on his/her body the audio equipment 14 and the audio output device 16.

Similarly, radio communication can be satisfactorily made by arranging the vehicular audio processing unit 10 inside the vicinity of the lateral side of the front cowl 92 attached to the front of the body frame 52 of the motorcycle 50 without attenuating an electromagnetic wave by the radio communication by the body frame 52 in the case that the user wears or supports on his/her body the audio equipment 14 and the audio output device 16. Furthermore, a radio communication range can be reduced by locating the vehicular audio processing unit 10 in the storage box 122L or 122R and radio communication can be further satisfactorily made.

As the case 10a of the vehicular audio processing unit 10 is made of metal and at least a part of the case 10a is made of the transmissive member 28 that transmits an electromagnetic wave used in radio communication, radio communication can be satisfactorily made via the transmissive member 28, while securing heat resistance and resistance to electromagnetic wave noise of the unit itself with the metal case 10a.

Furthermore, as the vehicular audio processing unit 10 is arranged with the transmissive member 28 directed upward in the motorcycle 50 or in the direction of the rider seats 78, 80, radio communication can be satisfactorily made.

The AUX IN terminal 26b and an analog cable connected to a fourth external device (not shown) are connected, the audio processor 156 acquires analog voice data from the fourth external device, and the audio processor may also apply audio processing based upon vehicle speed and engine speed to the acquired voice data. In this case, the audio processor 156 may also apply audio processing to the voice data in an acquired analog signal as it is or may also apply audio processing after the voice data in the acquired analog signal is converted to a digital signal. Furthermore, the audio processor 156 may also perform such audio processing that voice data in a voice file acquired from the audio equipment 14 or the USB memory 23 and voice data acquired from the fourth external device are mixed. Hereby, voice output acquired from the audio equipment 14 or the USB memory 23 and voice acquired from the fourth external device can be simultaneously listened to.

Furthermore, the LINE OUT terminal 26a and an analog cable connected to a fifth external device (not shown) are connected, the audio processor 156 converts voice data to which audio processing is applied to an analog signal, and the audio processor may also output voice data in the analog signal to the fifth external device via the LINE OUT terminal 26a. Hereby, voice output based upon the voice data to which the audio processing is applied can be listened to via the fifth external device.

The audio processor 156 may also switch to another party that will acquire voice data to which audio processing is applied and a destination of the output of voice data to which audio processing is applied according to the user's operation of the mode switching button 34 of the operating device 18. That is, the audio processor 156 acquires voice data from equipment selected by the operation of the mode switching button 34 from between devices including the audio equipment 14, the USB memory 23, and the fourth external device and applies audio processing to the acquired voice data. Additionally, the audio processor 156 outputs voice data to which audio processing is applied to equipment selected by the operation of the mode switching button 34 from between devices including the audio output device 16, the fifth external device, and the stereo speaker 22 (22L, 22R). Hereby, even if plural external devices and external equipment are connected, the other party that acquires voice data and the destination of the output can be easily selected by the user via the operating device 18.

The present invention has been described in conjunction with the present exemplary embodiment. However, the technical scope of the present invention is not limited to the range described in the above-mentioned embodiment. It is clear to those skilled in the art that various changes or improvements can be applied to the embodiment. It is clear from description in claims that an embodiment to which such a change or an improvement is applied can be also included in the technical scope of the present invention.

REFERENCE SIGN LIST

10 - - - Vehicular audio processing unit
10a - - - Case
12 - - - Communication system
14 - - - Audio equipment
16 - - - Audio output device
18 - - - Manual operating device
20 - - - Display
22, 22L, 22R - - - Stereo speaker
23 - - - USB memory
28 - - - Transmissive member
50 - - - Motorcycle 52 - - - Body frame
54 - - - Head pipe
60 - - - Steering handlebar
62 - - - Engine
70L, 70R - - - Main frame
74L, 74R - - - Seat frame
76 - - - Fuel tank
78 - - - Rider seat
80 - - - Pillion passenger seat
84 - - - Trunk box
90 - - - Body cover
92 - - - Front cowl
94 - - - Side cover
98 - - - Rear seat cowl
100L, 100R - - - Side bag
120 - - - Meter unit
122L, 122R - - - Storage box
152 - - - Controller
154 - - - Communication device
156 - - - Audio processor
158 - - - Amplifier
160 - - - Receiving means
162 - - - Transmitting means
164 - - - Vehicle speed sensor
166 - - - Engine speed sensor

We claim:

1. A vehicular audio processing unit, comprising:
a receiver that is configured to receive voice data by wirelessly communicating with a first external device;
an audio processor that applies predetermined audio processing to the voice data received by the receiver;
a transmitter that is configured to transmit the voice data to which the audio processor applies the predetermined audio processing by wirelessly communicating with a second external device that can output a sound; and
an operational status detector that detects an operational status of a vehicle with which the vehicular audio processing unit is provided,
wherein the audio processor modifies the predetermined audio processing based on the operational status detected by the operational status detector to the voice data received by the receiver,
wherein the operational status detector acquires running sound of a vehicle on which the vehicular audio processing unit is disposed, creates sound data in an opposite phase to sound data of the running sound, and mixes the sound data in an opposite phase to running sound with the voice data received by the receiver, and
wherein the operational status detector detects engine speed of an engine of the vehicle, the audio processor has a memory which stores sound data in an opposite phase to engine noise corresponding to the engine speed, and the audio processor performs the predetermined audio processing such that it mixes the sound data in an opposite phase to engine noise corresponding to the detected engine speed with the voice data received by the receiver.

2. The vehicular audio processing unit according to claim 1, wherein:
the operational status detector detects the speed of the vehicle; and
the audio processor performs the predetermined audio processing such that the higher the detected speed of the vehicle is, the more volume of the voice data received by the receiver is increased.

3. The vehicular audio processing unit according to claim 1, further comprising:
an analog voice input device configured to be connected to an other external device and to acquire analog voice data from other external device,
wherein the audio processor performs such audio processing that the analog voice data acquired by the analog voice input device is mixed with the voice data received by the receiver.

4. The vehicular audio processing unit according to claim 1,
wherein: the vehicle is a motorcycle; and
the vehicular audio processing unit is arranged on an upper part of a rear portion of a body frame of the motorcycle or on the lateral side of the rear portion.

5. The vehicular audio processing unit according to claim 1,
wherein: the vehicle is a motorcycle; and
the vehicular audio processing unit is arranged inside of a lateral side of a front cowl attached in front of a body frame of the motorcycle.

6. The vehicular audio processing unit according to claim 5, wherein a storage box is provided near the lateral side of the front cowl; and
the vehicular audio processing unit is arranged near the storage box.

7. The vehicular audio processing unit according to claim 1, wherein a case of the vehicular audio processing unit is made of metal; and
at least a part of the case includes a transmissive member that transmits an electromagnetic wave used in the transmitter and the receiver.

8. The vehicular audio processing unit according to claim 7, wherein the vehicular audio processing unit is arranged with the transmissive member either directed upward in the vehicle or directed toward a rider's seat of the vehicle.

9. A communication system comprising:
the vehicular audio processing unit according to claim 1;
the first and second external devices; and
an operating device connected to the vehicular audio processing unit and through which a user may input commands for operating the first external device, wherein
the transmitter transmits a signal corresponding to a user command from the operating device to the first external device.

10. The communication system according to claim 9, wherein the operating device is provided to a steering handle of the vehicle.

11. The communication system according to claim 1, wherein:
the vehicle is a motorcycle; and
the vehicular audio processing unit is arranged on an upper part of a rear portion of a body frame of the motorcycle or on the lateral side of the rear portion.

12. The communication system according to claim 9,
wherein: the vehicle is a motorcycle; and
the vehicular audio processing unit is arranged inside of a lateral side of a front cowl attached in front of a body frame of the motorcycle.

13. The communication system according to claim 12, wherein a storage box is provided near the lateral side of the front cowl;
the first external device is housed in the storage box; and
the vehicular audio processing unit is arranged near the storage box.

14. The communication system according to claim 9, wherein:
- the operational status detector detects the speed of the vehicle; and
- the audio processor performs the predetermined audio processing such that the higher the detected speed of the vehicle is, the more volume of the voice data received by the receiver is increased.

15. The communication system according to claim 9, wherein a case of the vehicular audio processing unit is made of metal; and
- at least a part of the case includes a transmissive member that transmits an electromagnetic wave used in the transmitter and the receiver.

16. The communication system according to claim 15, wherein the vehicular audio processing unit is arranged with the transmissive member either directed upward in the vehicle or directed toward a rider's seat of the vehicle.

17. The communication system according to claim 9, wherein the communication system further includes a microphone through which the operational status detector acquires the running sound of the vehicle on which the vehicular audio processing unit is disposed.

\* \* \* \* \*